(12) United States Patent
Chen et al.

(10) Patent No.: US 10,128,203 B2
(45) Date of Patent: Nov. 13, 2018

(54) FAN-OUT PACKAGE STRUCTURE, ANTENNA SYSTEM AND ASSOCIATED METHOD

(71) Applicant: TAIWAN SEMICONDUCTOR MANUFACTURING COMPANY LTD., Hsinchu (TW)

(72) Inventors: Wei-Ting Chen, Tainan (TW); Tzu-Chun Tang, Kaohsiung (TW); Ming Hung Tseng, Miaoli County (TW); In-Tsang Lin, Kaohsiung (TW); Vincent Chen, Taipei (TW); Chuei-Tang Wang, Taichung (TW); Hung-Yi Kuo, Taipei (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 15/013,678

(22) Filed: Feb. 2, 2016

(65) Prior Publication Data

US 2017/0221838 A1 Aug. 3, 2017

(51) Int. Cl.
| | | |
|---|---|---|
| *H01L 29/82* | (2006.01) | |
| *H01L 23/66* | (2006.01) | |
| *H01Q 1/38* | (2006.01) | |
| *H01L 23/528* | (2006.01) | |
| *H01L 23/522* | (2006.01) | |
| *H01L 25/18* | (2006.01) | |
| *H01L 21/683* | (2006.01) | |

(Continued)

(52) U.S. Cl.
CPC .......... *H01L 23/66* (2013.01); *H01L 21/6835* (2013.01); *H01L 23/528* (2013.01); *H01L 23/5227* (2013.01); *H01L 23/585* (2013.01); *H01L 25/18* (2013.01); *H01Q 1/243* (2013.01); *H01Q 1/38* (2013.01); *H01Q 5/385* (2015.01); *H01Q 7/00* (2013.01); *H01L 2223/6677* (2013.01)

(58) Field of Classification Search
CPC ...................................................... H01L 23/66
USPC .......................................................... 257/421
See application file for complete search history.

(56) References Cited

U.S. PATENT DOCUMENTS

| | | | |
|---|---|---|---|
| 8,779,564 B1 * | 7/2014 | Knudsen | H01L 23/66 257/660 |
| 9,711,465 B2 * | 7/2017 | Liao | H01L 23/66 |

(Continued)

OTHER PUBLICATIONS

Dou et al., "Novel Meandered Planar Inverted-F Antenna for Triple-Frequency Operation,", Microwave and Optical Technology Letters, vol. 27, No. 1, Oct. 5, 2000, pp. 58-60.*

*Primary Examiner* — Igwe U Anya
(74) *Attorney, Agent, or Firm* — WPAT, P.C., Intellectual Property Attorneys; Anthony King

(57) ABSTRACT

A fan-out package structure is disclosed. The fan-out package structure includes an antenna main body; a redistribution layer (RDL); and an antenna auxiliary body in the RDL. An antenna system is also disclosed. The antenna system includes: an antenna main body, arranged to provide a first resonance; and an antenna auxiliary body, arranged to provide a second resonance through parasitic coupling to the antenna main body; wherein a dimension of the antenna main body is greater than a dimension of the antenna auxiliary body. An associated semiconductor packaging method is also disclosed.

18 Claims, 17 Drawing Sheets

(51) Int. Cl.
*H01L 23/58* (2006.01)
*H01Q 1/24* (2006.01)
*H01Q 7/00* (2006.01)
*H01Q 5/385* (2015.01)

(56) References Cited

U.S. PATENT DOCUMENTS

| | | | | |
|---|---|---|---|---|
| 2007/0166954 | A1* | 7/2007 | Yamazaki | G06K 19/07749 |
| | | | | 438/452 |
| 2008/0149731 | A1* | 6/2008 | Arai | G06K 19/07718 |
| | | | | 235/492 |
| 2008/0169349 | A1* | 7/2008 | Suzuki | H01L 21/84 |
| | | | | 235/492 |
| 2009/0289869 | A1* | 11/2009 | Babakhani | H01Q 15/08 |
| | | | | 343/850 |
| 2012/0104574 | A1* | 5/2012 | Boeck | H01L 23/49816 |
| | | | | 257/660 |
| 2014/0070420 | A1* | 3/2014 | Sapone | H01L 21/568 |
| | | | | 257/773 |
| 2015/0177373 | A1* | 6/2015 | Boeck | G01S 7/02 |
| | | | | 342/52 |
| 2015/0268742 | A1* | 9/2015 | Park | G06F 3/03545 |
| | | | | 345/179 |

* cited by examiner

FAN-OUT PACKAGE STRUCTURE, ANTENNA SYSTEM AND ASSOCIATED METHOD

BACKGROUND

The design of antennas for mobile telephones capable of operation in more than one frequency band (e.g., dual mode) is constrained by the market demand continually to reduce the overall size of telephones. An antenna for a smart phone with extremely light weight will need to be especially compact while still being capable of providing satisfactory performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
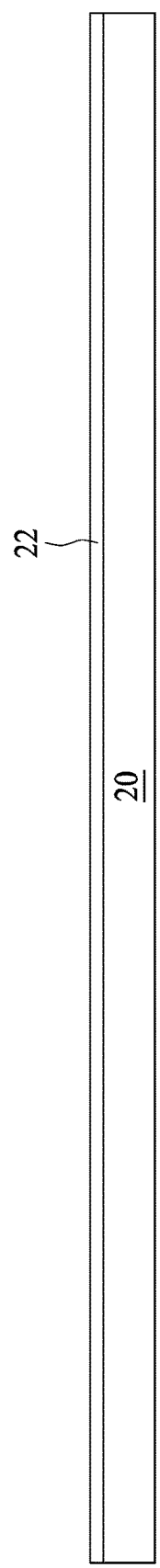
FIGS. 1 through 7 are schematic views and cross sectional views illustrating intermediate stages in the manufacturing of a fan-out structure including a multi-mode antenna in accordance with some exemplary embodiments of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

A multi-mode antenna capable of operation in more than one frequency band is disclosed. In an exemplary embodiment, the multi-mode antenna is embedded in a fan-out package structure having at least one antenna main body included and the methods of forming the same are also provided. The intermediate stages of forming the fan-out package structure are illustrated. The variations of the embodiments are discussed. Throughout the various views and illustrative embodiments, like reference numbers are used to designate like elements.

FIGS. 1 through 7 are schematic views illustrating intermediate stages in the manufacturing of a fan-out structure including a multi-mode antenna in accordance with some exemplary embodiments of the present disclosure. FIG. 1 is a cross-sectional view illustrating a carrier 20, and an adhesive layer 22 on the carrier 20. The carrier 20 may be a glass carrier, a ceramic carrier, or the like. The adhesive layer 22 may be formed of an adhesive such as an adhesive film.

Figure 2A:
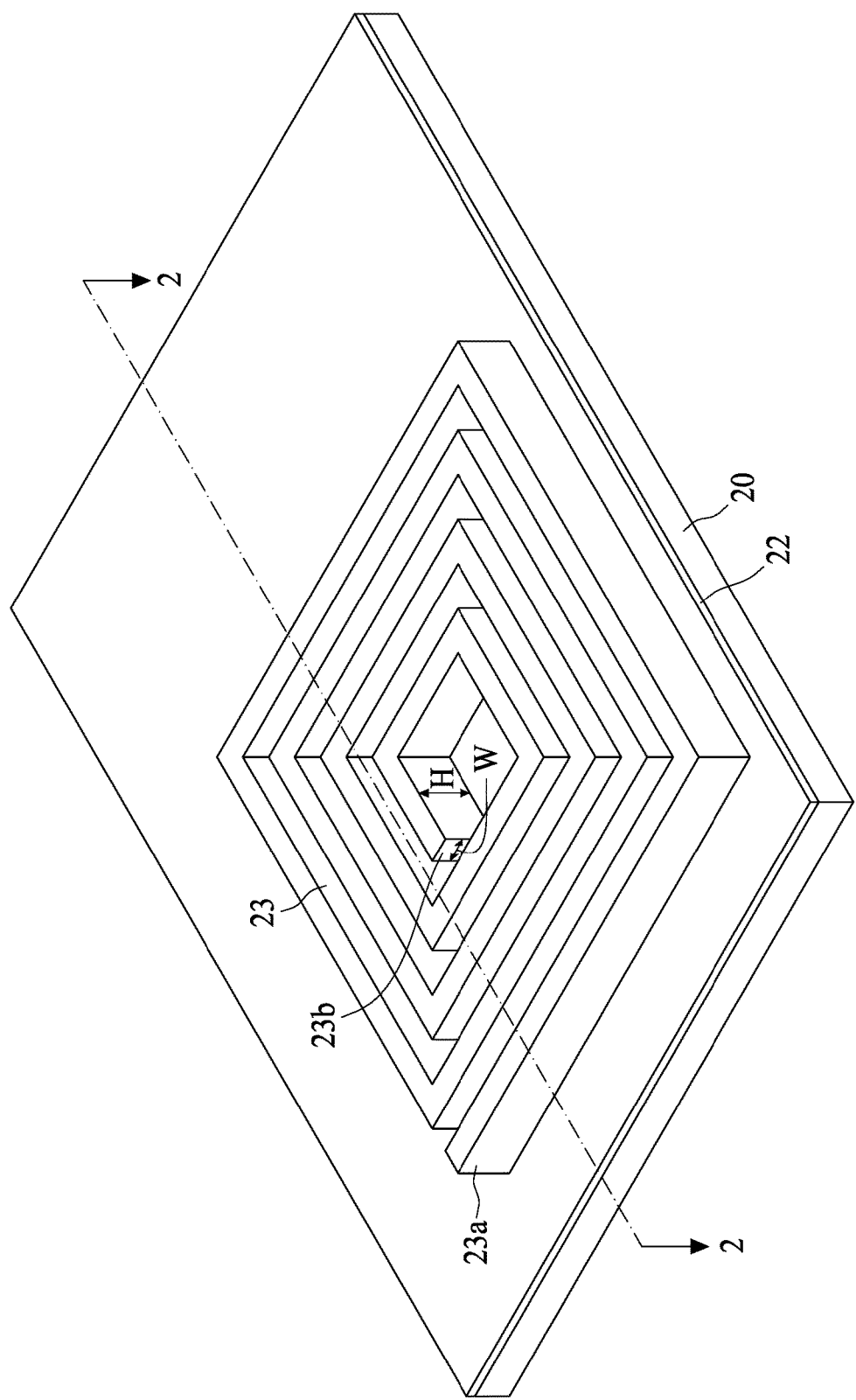

FIG. 2A is a three-dimensional perspective view illustrating the placement of a spiral coil 23 over the carrier 20. The spiral coil 23 is a 16 mm planar spiral coil inductor with 4 turns utilized as an antenna main body and has a basic profile of a polygon when seen from a top view perspective. In this embodiment, the spiral coil 23 outlines a quadrilateral shape in a dimension of 16 mm*16 mm from a top view perspective. In some embodiments, the spiral coil 23 may be arranged in a foursquare shape, an equilateral polygon shape, a circular shape or an oval shape from a top view perspective. In some embodiments, the spiral coil 23 may have rounded corners. The spiral coil 23 has a polygon, circular or oval cross-section, and the cross-section has a height H and width W as shown in FIG. 2A. In this embodiment, the height H is about 150 um. In some embodiments, the height H may be in a range of about 100-200 um. Please note that it is not intended for the invention to be limited to the geometry examples shown herein. The spiral coil 23 includes a first end 23a at the outermost coil turn and a second end 23b at the innermost coil turn.

Figure 2B:
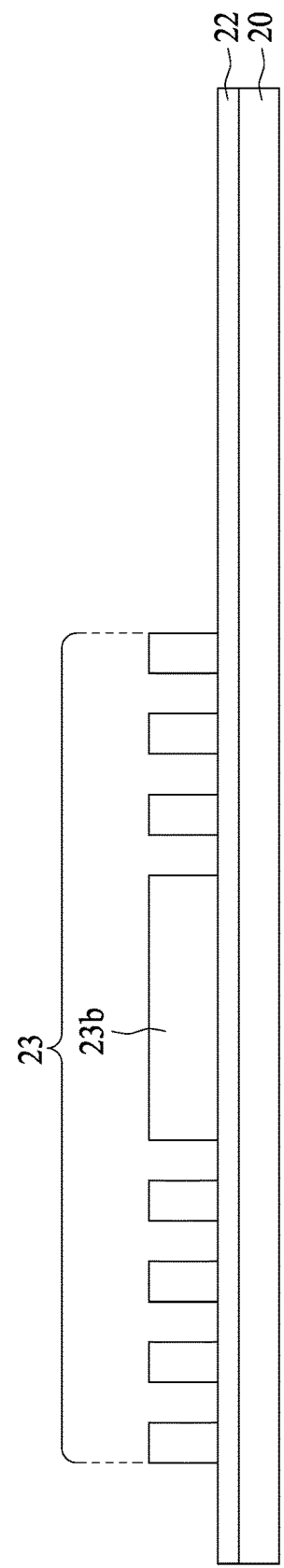

The spiral coil 23 is a component fabricated elsewhere and subsequently being placed on the carrier 20. In some embodiments, the spiral coil 23 may be comprised of copper (Cu) and fabricated by operations such as low-cost punching, wet etching or laser-cutting. The spiral coil 23 made by said operations has an increased thickness (i.e. H) and thus a greater depth-to-width ratio (i.e. the ratio of H and W, also called aspect ratio) comparing to existing spiral coil prepared by electroplating methods on a patterned substrate. Under a fixed width, a greater depth provides a larger cross-sectional area for the spiral coil 23 thus increasing the entire inductance. In some embodiments, the depth-to-width ratio may exceed 2. In some embodiments, the depth-to-width ratio is 2.5. FIG. 2B is a cross-sectional view illustrating the placement of the spiral coil 23 over the carrier 20 taken along the lines 2-2 of FIG. 2A.

In some embodiments, a pick and place machine may be employed to mount the planar spiral coil 23 onto a wafer one by one. The pick and place machine may include a vacuum nozzle with a plurality of holes thereon to provide a vacuum suction force in order to securely hold the planar spiral coil 23 when moving the planar spiral coil 23 from a tray to a specified position on the wafer. In some other embodiments, a vibration parts alignment apparatus may be employed to mount a group of the planar spiral coils 23 onto a wafer at one time, as opposed to the aforesaid pick and place operations. The vibration parts alignment apparatus may include a coils alignment pallet fixedly supported by a vibration generator, wherein the coils alignment pallet has a plurality of recesses for alignment of the group of planar spiral coils 23 during vibration of the vibration generator. Thereafter, the wafer is flipped and attached to the coils alignment pallet so that the group of planar spiral coils 23 can be transferred from the pallet to the wafer through a press and heating operation.

Figure 3A:
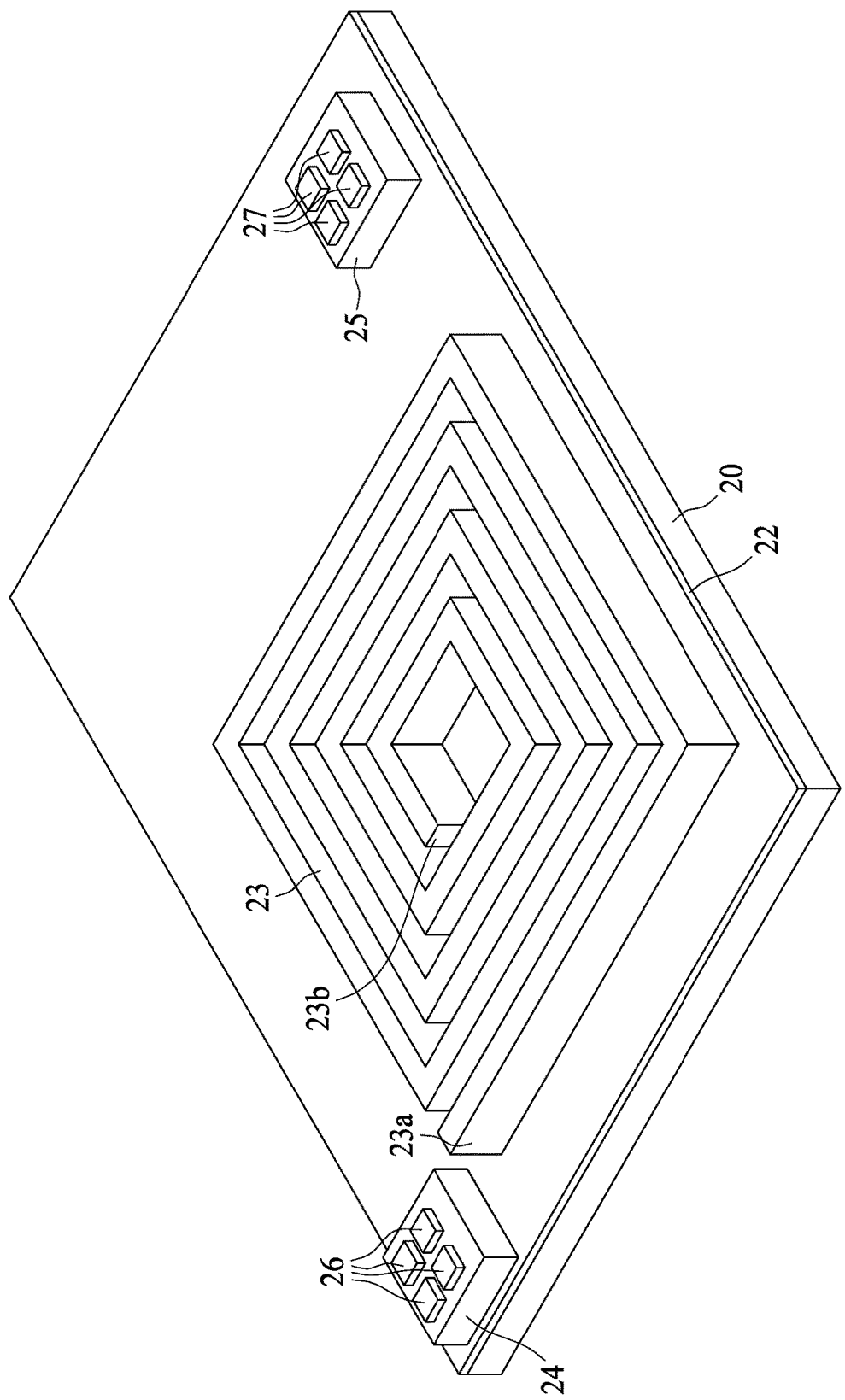

FIG. 3A is a three-dimensional perspective view illustrating the placement of dies 24 and 25 over the carrier 20. The die 24 and die 25 are placed over the carrier 20 by the side of the spiral coil 23. In some embodiments, the die 24 and die 25 are attached to the adhesive layer 22, which is adhered to the carrier 20. The die 24 may be a logic device die including logic transistors therein and is cooperatively work with the antenna main body. For example, the die 24 is an integrated circuit (IC) including charging related functions, and the die 25 is a Bluetooth IC. In some embodiments, integrated passive devices (IPD) such as resistors, capacitors and inductors may be also included in the die 24 and 25. In some embodiments, the spiral coil 23 outlines a quadrilateral shape in a dimension of 16 mm*16 mm from a top view perspective, and the die 24 and 25 each includes a dimension of 3 mm*3 mm from a top view perspective.

Electrical connectors 26 and 27 are formed as the top portions of the dies 24 and 25 respectively, and are electrically coupled to the devices in the dies 24 and 25. In some embodiments, the electrical connectors 26 and 27 include metal pillars (such as copper pillars), which may be preformed before the device dies 24 and 25 are placed over the carrier 20. The metal pillars 26 and 27 may be solder-free, and may comprise vertical sidewalls. In some embodiments, dielectric layers are formed at the top surfaces of the dies 24 25, with metal pillars 26 and 27 having at least lower portions, or entireties, in the dielectric layer. The top surfaces of the dielectric layers may also be substantially level with the top ends of the metal pillars 26 and 27. The dielectric layers may be comprised of polyimide, polybenzoxazole (PBO), an oxide layer, a nitride layer, or multi-layers thereof. When the dielectric layers are not formed, the metal pillars 26 and 27 protrude above the top surfaces of the dies 24 25. In this embodiment, the dielectric layers are not depicted in the FIG. 3A and subsequent drawings.

The dies 24 and 25 are attached to the adhesive layer 22, which is adhered to the carrier 20. The thicknesses of the dies 24, 25 and the heights of metal pillars 26 and 27 are controlled so that the top ends of the metal pillars 26 and 27 of the dies 24 and 25 are substantially level with the height H of the spiral coil 23. Furthermore, since the dies 24, 25 and the spiral coil 23 are placed on the adhesive 22, the back surfaces of the dies 24, 25 and the spiral coil 23 are level with each other.

Figure 3B:
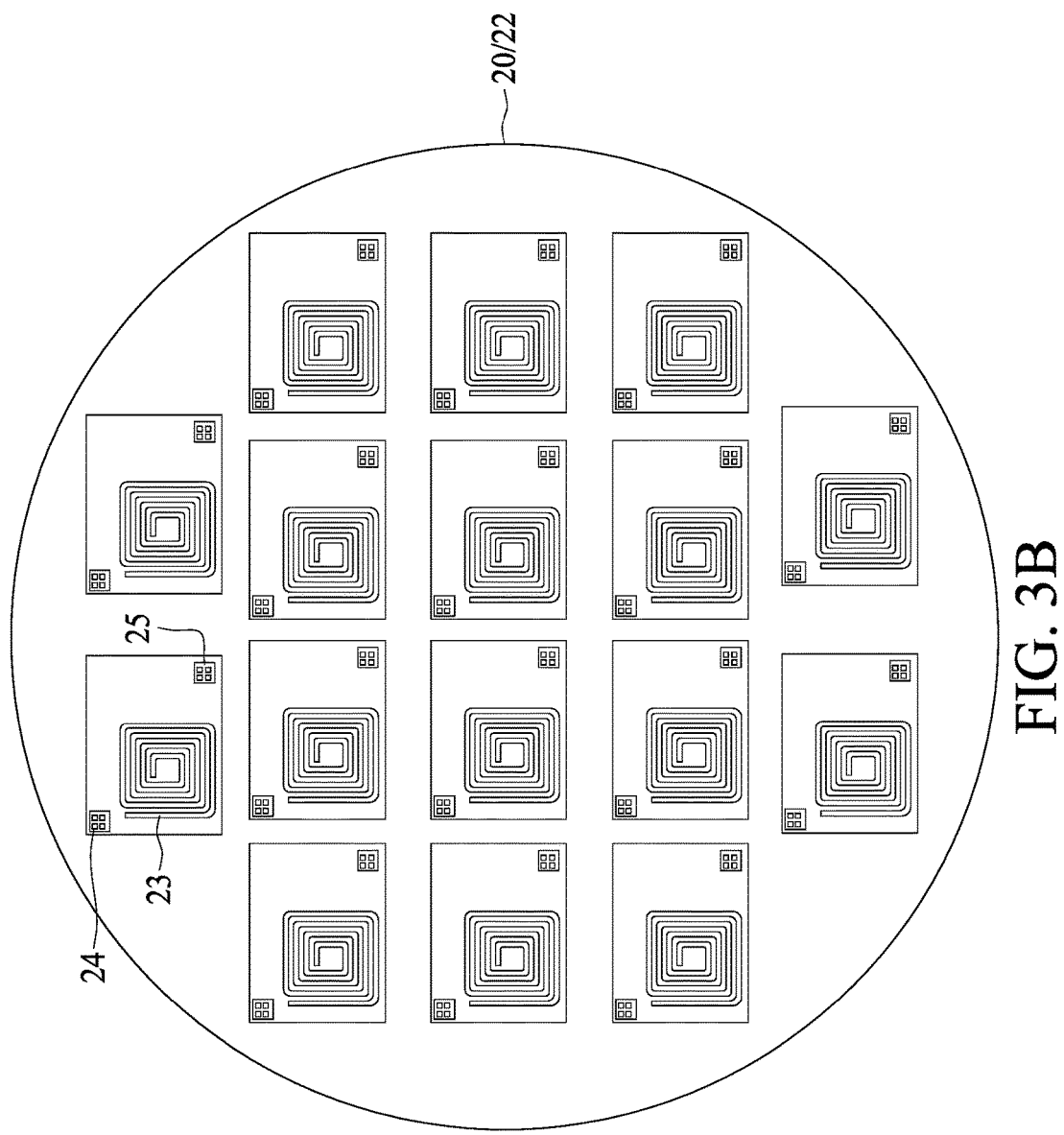

FIG. 3B illustrates a top view of the structure in FIG. 3A. In some embodiments, the placement of the dies 24, 25 and the spiral coil 23 is at a wafer level, and hence there are a plurality of dies 24, 25 and spiral coil 23 placed over the carrier 20. FIG. 3B illustrates that the carrier 20 has a round top-view shape. In alternative embodiments, the carrier 20 may also have a rectangular top-view shape, and the dies and 25 may be laid out as an array. In FIG. 3B, the rectangles (not marked) encircling each groups of the dies 24, 25 and the spiral coil 23 define boundaries of the respective packages formed in subsequent operations.

Figure 4:
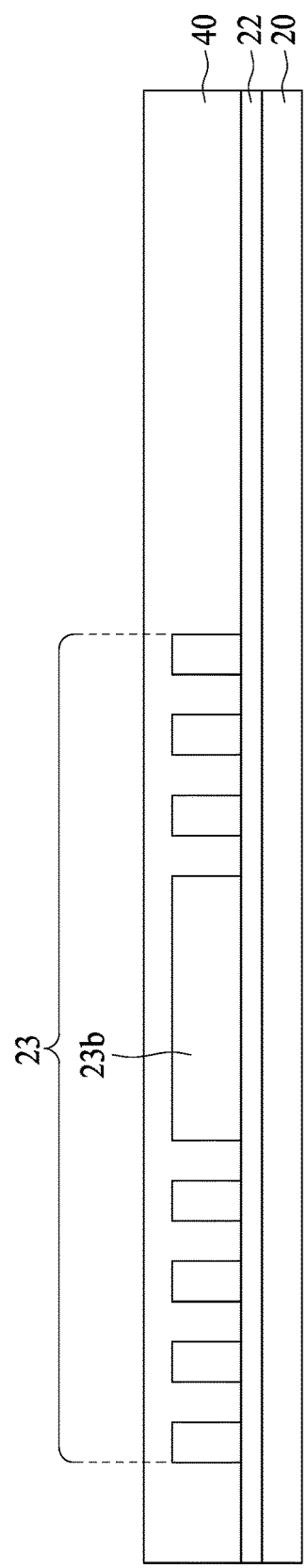

Referring to FIG. 4, a molding material 40 is dispensed and molded on the dies 24, 25 and the spiral coil 23. Relative displacement of the dies 24, 25 and the spiral coil 23 can be referred to FIG. 3A previously discussed. The molding material 40 fills the gaps between the dies 24, 25 and the spiral coil 23, and may be in contact with the adhesive layer 22. Furthermore, the molding material 40 may be filled into the gaps between the metal pillars 26 and 27 if the dielectric layers are not formed on the top surface of the dies 24 and 25. The molding material 40 is comprised of a polymer in some embodiments. For example, the molding material 40 may include a molding compound, a molding underfill, an epoxy, or a resin. A top surface of the molding material 40 is higher than the top ends of the metal pillars 26, 27 and the spiral coil 23. The bottom surface of the molding material 40 is substantially level with the back surfaces of the dies 24, 25 and the spiral coil 23. After being dispensed, the molding material 40 is cured.

Figure 5:
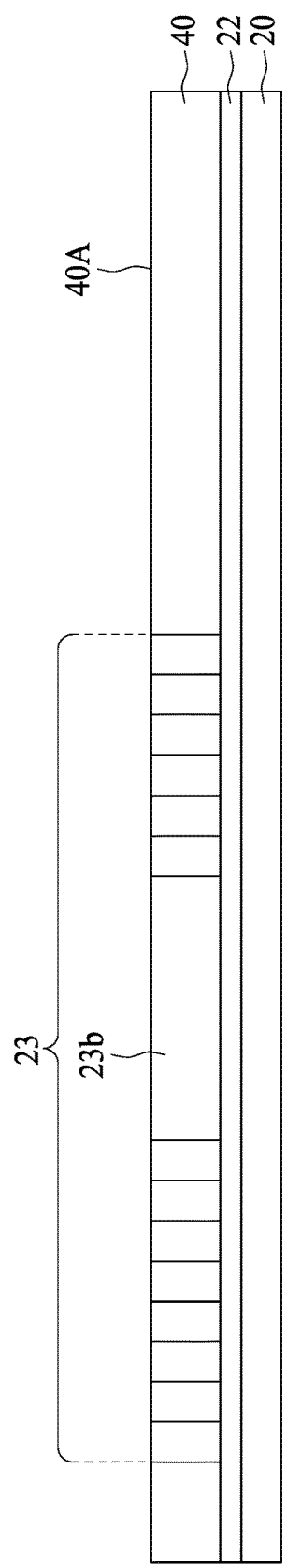

Next, a planarization operation, which may be a grinding operation or a Chemical Mechanical Polish (CMP) operation, is performed to thin the molding material 40. The planarization operation may be completed until the top ends of the metal pillars 26, 27 and the spiral coil 23 are exposed. The resulting structure is shown in FIG. 5. Relative displacement of the top ends of the metal pillars 26, 27 and the top ends of spiral coil 23 can be referred to FIG. 3A previously discussed. The top ends of the spiral coil 23 and the metal pillars 26 and 27 in the dies 24 and 25 are level with each other, and are level with a top surface 40A of the molding material 40. In some embodiments in which no dielectric layer is formed, the molding material 40 encircles, and is in contact with, each of the metal pillars 26 and 27. In alternative embodiments in which the dielectric layers are formed, the top ends of the metal pillars 26 and 27 are level with each other, and are substantially level with the surfaces of the dielectric layers and the top surface 40A of the molding material 40.

Figure 6A:
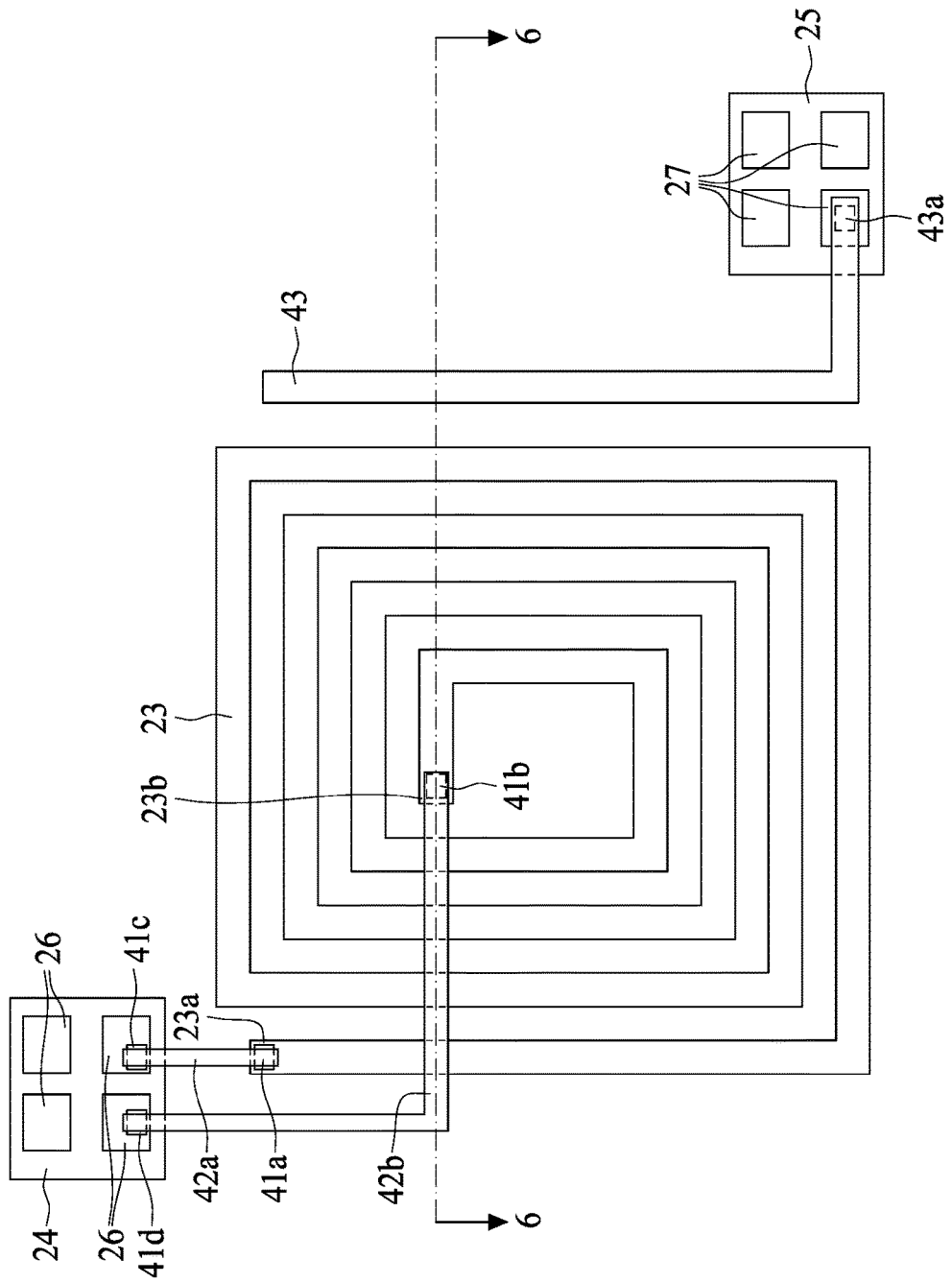
Figure 6B:
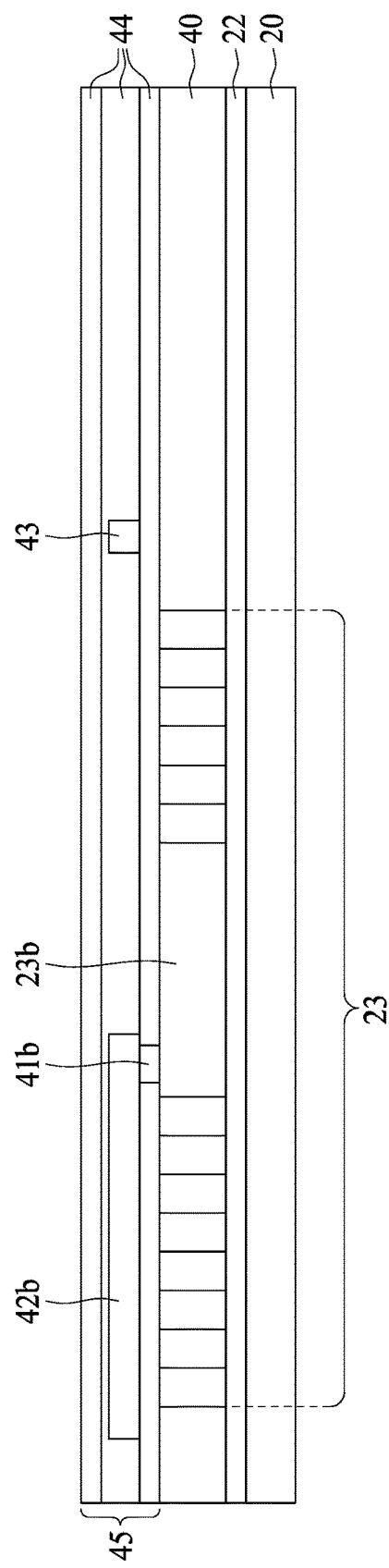

Next, referring to FIGS. 6A and 6B, FIG. 6B is a cross-sectional view taken along the lines 6-6 of FIG. 6A. A redistribution layer (RDL) 45 is formed over the molding material 40. The RDL 45 includes dielectric layers 44 and a plurality of conductive patterns 41a, 41b, 41c, 41d, 42a, 42b, 43a and 43 reside therein, wherein only the conductive patterns 41b, 42b and 43 are shown in FIG. 6B due to the fact that a cutting line only passes through the conductive patterns 41b, 42b and 43. There may be one, two, three, or more dielectric layers 44, each including a plurality of connection conductive patterns at the same level. The conductive patterns 41a, 41b, 41c and 41d are vias that interconnect the conductive patterns 42a and 42b in an up neighboring redistribution layer to the spiral coil 23 and the die 24. In this way, the first end 23a and the second end 23b of the spiral coil 23 are connected with the die 24. The L-shaped conductive pattern 43 has a height of about 7 um and is utilized as an antenna auxiliary body, and is located along a side of the spiral coil 23 so that a longer segment of the L-shaped conductive pattern 43 is parallel to the right side of the spiral coil 23. The conductive pattern 43 is connected to the die 25 through the via 43a. In some embodiments, a horizontal distance between the conductive pattern 43 and the outermost coil turn of the spiral coil 23 is determined as a result of impedance matching and capacitance coupling design. Under a scenario where the spiral coil 23 outlines a dimension of 16 mm*16 mm and the die 25 includes a dimension of 3 mm*3 mm from a top view perspective, the horizontal distance is in a range of from about 100 μm to about 150 μm.

The vias 41a, 41b, 41c, 41d and 43a in the bottom redistribution layer and the respective dielectric layer 44 have a height of about 4.5 um and have a bottom surface in contact with the top ends of the metal pillars 26, 27, the spiral coil 23 and the top surface 40A of the molding material 40. In some embodiments, the RDL 45 are formed by forming and patterning the dielectric layers 44, and forming the conductive patterns 41a, 41b, 41c, 41d, 42a, 42b, 43a and 43 in the openings in the patterned dielectric layers 44. In alternative embodiments, the RDL 45 is formed by depositing metal layers, patterning the metal layers, and filling the gaps between the conductive patterns 41a, 41b, 41c, 41d, 42a, 42b, 43a and 43 with the dielectric layers 44. In yet alternative embodiments, the RDL 45 may be formed using damascene processes. The RDL 45 may be comprised of copper, nickel, palladium, aluminum, tungsten, or the like. The dielectric layers 44 may comprise photo-sensitive materials such as polyimide, PBO, or the like, which may be patterned without using additional photo resists. The dielectric layers 44 may also be formed of a non-organic material or materials such as oxides and/or nitrides.

In this embodiment, the charging IC 24 may be configured to detect a wireless charger positioned within an associated near-field region and configured to transmit wireless power, via near-field resonance, at 6.78 MHz through the antenna main body 23. In addition, the antenna auxiliary body 43 provides 2.45 GHz resonance through parasitic coupling to the antenna main body 23. The term parasitically coupled refers to parasitic coupling between a first element and a second element when the elements are adjacent and when the elements separated by other elements wherein energy is parasitically coupled form the first element to any number of elements in series and then parasitically coupled to the second element. In this way, the charging IC 24 and the Bluetooth IC 25 can operate at the same time through the shared antenna main body 23 and the antenna auxiliary body 43, and a total area and cost of the antenna main body 23 and the antenna auxiliary body 43 is less than two individual antennas dedicated for the charging IC 24 and the Bluetooth IC 25. In this way, a total area of a semiconductor device can be reduced.

Figure 7:
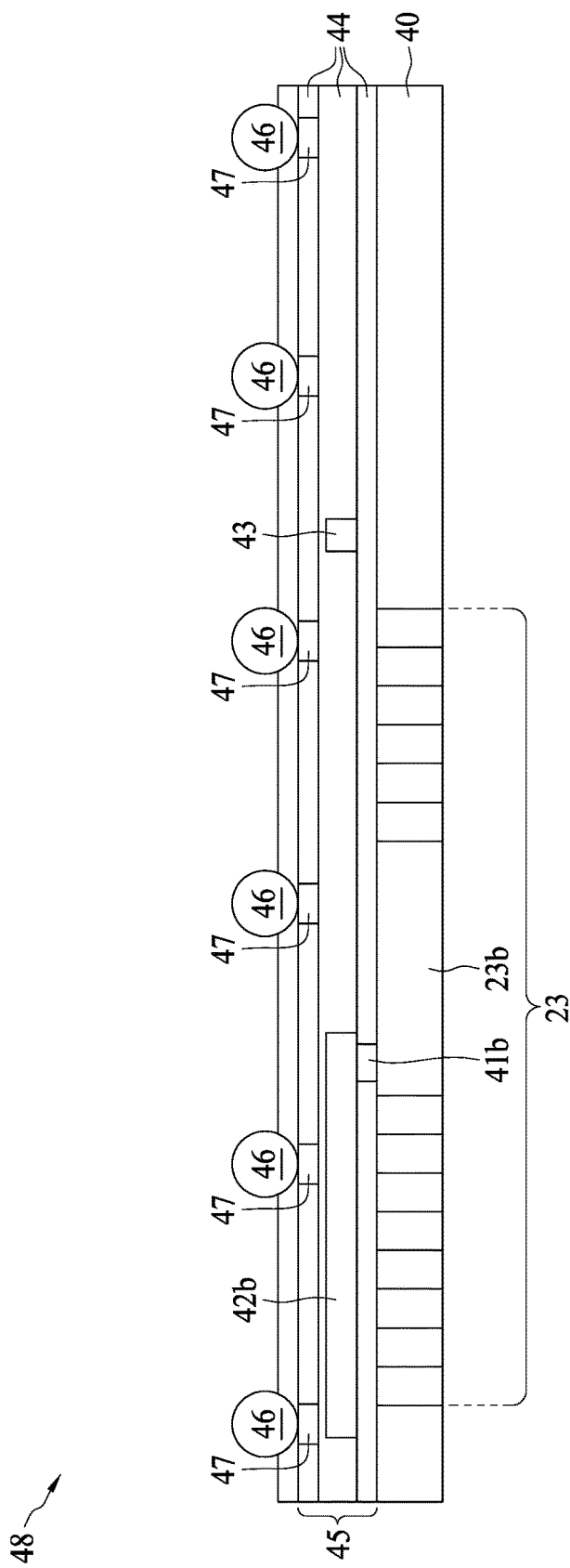

FIG. 7 illustrates the formation of electrical connectors 46 in accordance with some exemplary embodiments. The formation of the connectors 46 may include placing solder balls on exposed portions of the conductive patterns 47, and reflowing the solder balls. In alternative embodiments, the formation of the connectors 46 includes performing a plating operation to form copper or solder regions over the exposed portions of the conductive patterns 47. The connectors 46 may also include metal pillars, or metal pillars and solder caps, which may also be formed through plating. The carrier 20 is detached from the package 48 and the adhesive layer 22 may be removed. The combined structure including the dies 24, 25, the spiral coil 23, the molding material 40, the overlying RDL 45 and the connectors 46 is referred to as a fan-out package 48. The fan-out package 48 occupies a portion of a wafer that includes a plurality of fan-out packages, and the wafer is die-sawed along scribe lines into a plurality of fan-out packages.

The exemplary embodiment described above provides a fan-out package including dies and a spiral coil integrated therein. The spiral coil integrated in the fan-out package discussed herein possesses a higher depth-to-width ratio comparing to existing counterparts prepared by electroplating so that when providing the same performance, a form factor of the spiral coil of the present disclosure is smaller. In addition, the spiral coil of the present disclosure has a higher copper purity and a lower residual stress comparing to the existing counterparts.

Figure 8:
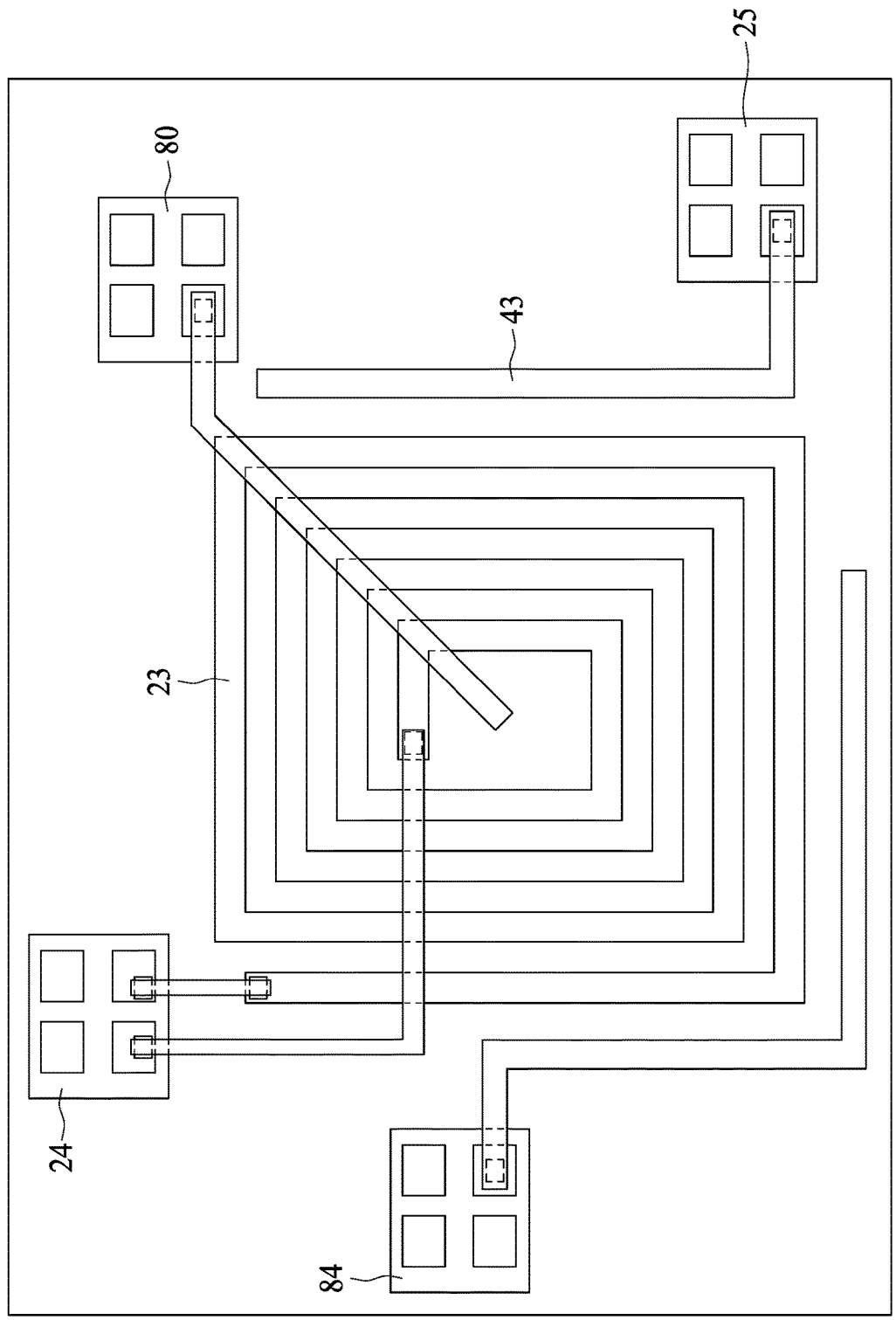
FIG. 8 is a top view illustrating a multi-mode antenna system according to a second embodiment of the present disclosure.

In some embodiments, more wireless communication system application may be further incorporated into the charging and Bluetooth system, for example, as shown in FIG. 8. FIG. 8 is a top view illustrating a multi-mode antenna system according to a second embodiment of the present disclosure. A Long Term Evolution (LTE) IC 84 and a wireless fidelity (WiFi) IC 80 are further merged into the fan-out package 48. A corresponding LTE antenna auxiliary body 86 and a corresponding WiFi antenna auxiliary body 82 are employed to be parasitically coupled to the antenna main body 23. In this way, a four mode antenna system is achieved by sharing the antenna main body 23 and three antenna auxiliary bodies 43, 82 and 86. Compared with a system using four individual antennas, the disclosed four-mode antenna system has a reduced area, cost and interference between antennas.

Please note that in some embodiments, the spiral coil 23, i.e. the antenna main body, may also be formed through a pattern and deposition operation in the RDL. Furthermore, the concept of the multi-mode antenna may also be applied to occasions other than wafer level package process. For example, the concept of the present disclosure may be applied to antennas on a printed circuit board (PCB) through copper traces. In another example, the concept of the present disclosure may be applied to antennas in a semiconductor die through metal lines. In some embodiments, the pattern of the antenna main body may be altered according to various design requirements. Some alternative designs are described in the following paragraphs.

Figure 9A:
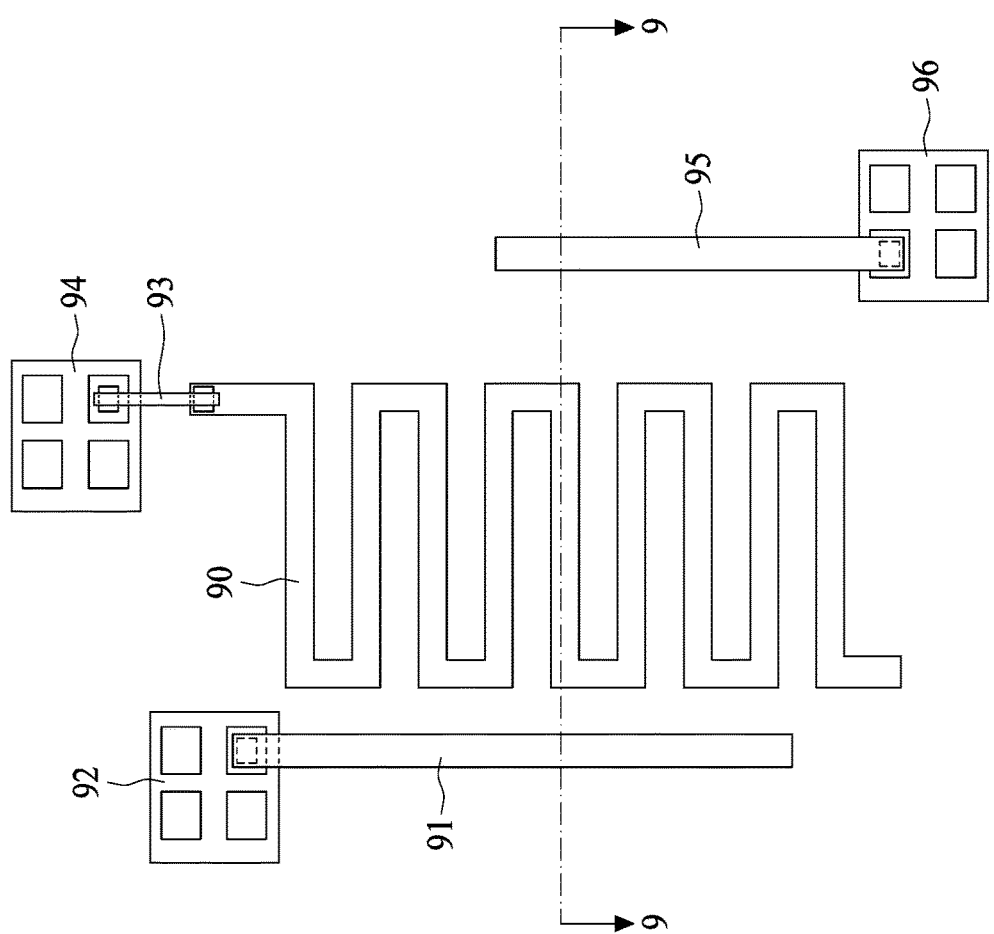
FIG. 9A is a top view illustrating a multi-mode antenna system according to a third embodiment of the present disclosure.

FIG. 9A is a top view illustrating a multi-mode antenna system according to a third embodiment of the present disclosure. The multi-mode antenna system shown in FIG.

9A is a three-mode antenna system including a planar meandered inverted-F antenna (MIFA) 90 used as an antenna main body coupled to an LTE IC 94 through a conductive pattern 93 for an LTE related application. The three-mode antenna system further includes an antenna auxiliary body 91 coupled to a WiFi IC 92 for a WiFi related application, wherein the antenna auxiliary body 91 is parasitically coupled to a side of the MIFA 90 as shown in FIG. 9A. Another antenna auxiliary body 95 is coupled to a Bluetooth IC 96 for a related application, wherein the antenna auxiliary body 95 is parasitically coupled to another side of the MIFA 90 as shown in FIG. 9A.

Figure 9B:
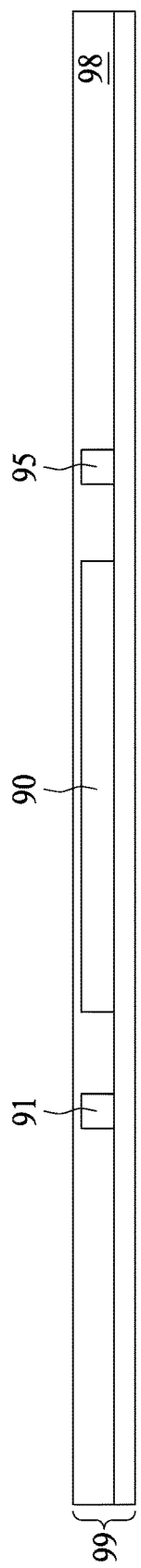
FIG. 9B is a cross-sectional view taken along the lines 9-9 of FIG. 9A.

FIG. 9B is a cross-sectional view taken along the lines 9-9 of FIG. 9A. Please note that for simplicity, FIG. 9B only illustrates an RDL 99 where the antenna bodies reside. As can be seen from FIG. 9B, the antenna main body 90, i.e. the MIFA, is comprised of a conductive pattern formed in a dielectric layer 98 of the RDL 99. The antenna auxiliary bodies 91 and 95 are formed in the same dielectric layer 98 of the RDL 99. The antenna main body 90 and auxiliary bodies 91 and 95 may be formed through a pattern and deposition operation in the RDL 99 as mentioned above. However, this is not a limitation of the present disclosure.

Figure 10A:
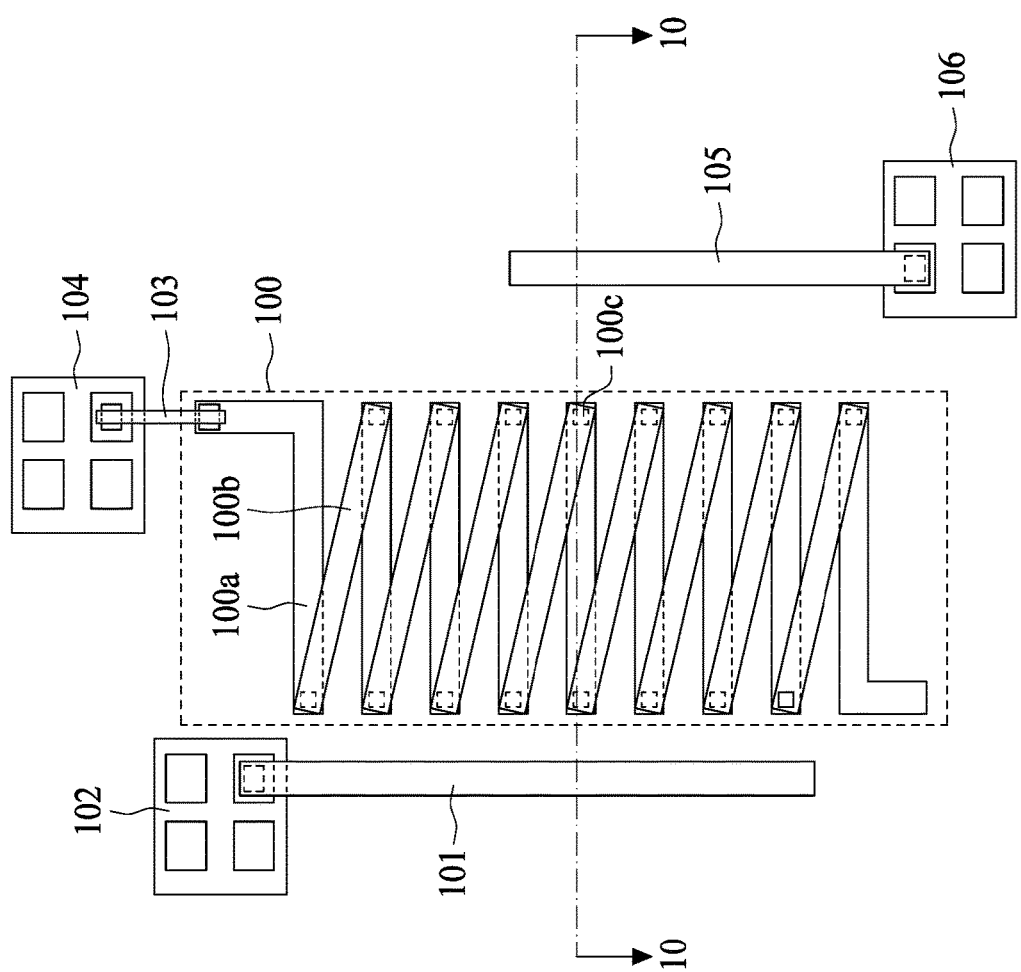
FIG. 10A is a top view illustrating a multi-mode antenna system according to a fourth embodiment of the present disclosure.

FIG. 10A is a top view illustrating a multi-mode antenna system according to a fourth embodiment of the present disclosure. The multi-mode antenna system shown in FIG. 10A is a three-mode antenna system including a zigzag antenna 100 used as an antenna main body coupled to an LTE IC 104 through a conductive pattern 103 for an LTE related application. The three-mode antenna system further includes an antenna auxiliary body 101 coupled to a WiFi IC 102 for a WiFi related application, wherein the antenna auxiliary body 101 is parasitically coupled to a side of the zigzag antenna 100 as shown in FIG. 10A. Another antenna auxiliary body 105 is coupled to a Bluetooth IC 106 for a related application, wherein the antenna auxiliary body 105 is parasitically coupled to another side of the zigzag antenna 100 as shown in FIG. 10A.

Figure 10B:
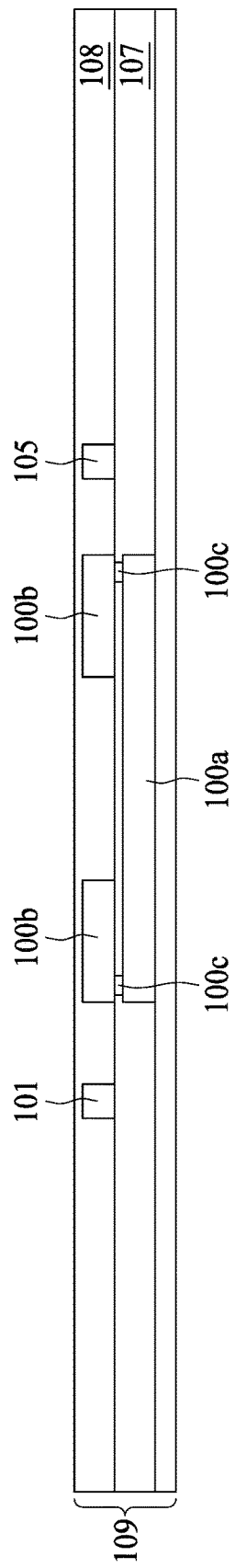
FIG. 10B is a cross-sectional view taken along the lines 10-10 of FIG. 10A.

FIG. 10B is a cross-sectional view taken along the lines 10-10 of FIG. 10A. Please note that for simplicity, FIG. 10B only illustrates an RDL 109 where the antenna bodies reside. As can be seen from FIG. 10B, the zigzag antenna 100 is comprised of conductive lines 100a and 100b formed in dielectric layers 107 and 108 of the RDL 109, wherein vias 100c is also formed in the dielectric layers 107 and 108 so as to interconnect the conductive lines 100a and 100b and thereby forming the zigzag antenna 100. The antenna auxiliary bodies 101 and 105 are formed in the dielectric layer 108 of the RDL 109. The antenna main body 100 and auxiliary bodies 101 and 105 may be formed through a pattern and deposition operation in the RDL 109 as mentioned above. However, this is not a limitation of the present disclosure.

Figure 11A:
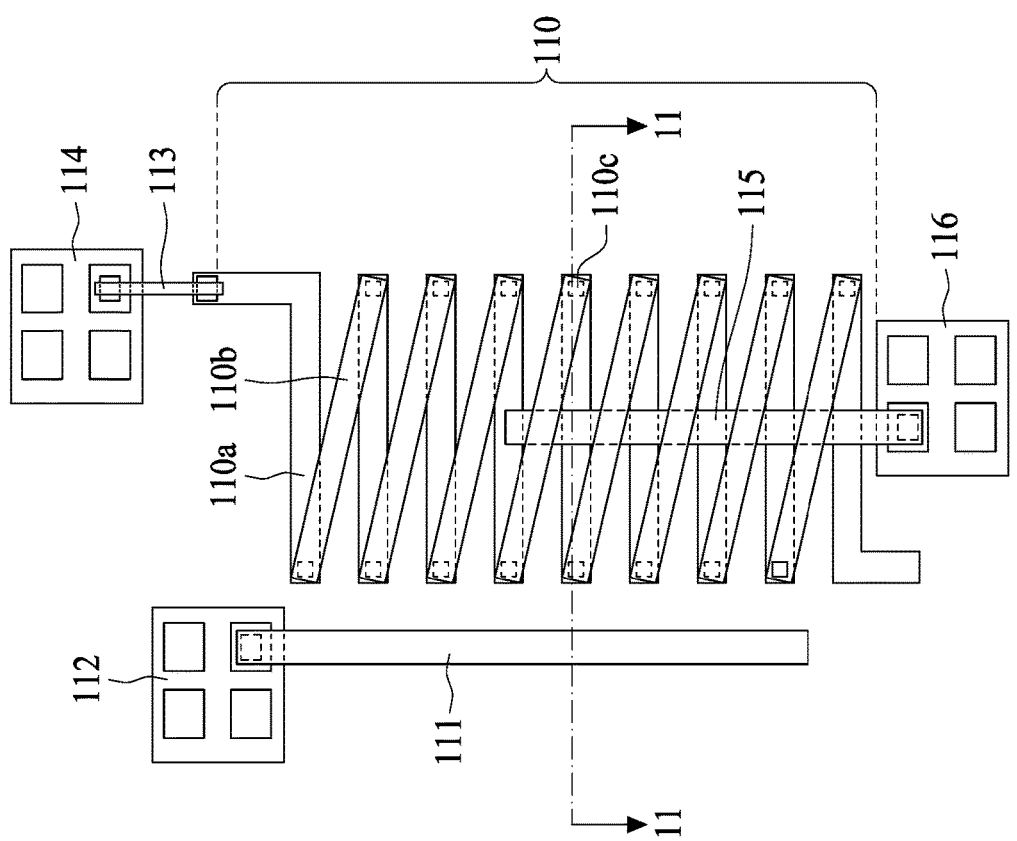
FIG. 11A is a top view illustrating a multi-mode antenna system according to a fifth embodiment of the present disclosure.

FIG. 11A is a top view illustrating a multi-mode antenna system according to a fifth embodiment of the present disclosure. The multi-mode antenna system shown in FIG. 11A is a three-mode antenna system including a zigzag antenna 110 used as an antenna main body coupled to an LTE IC 114 through a conductive pattern 113 for an LTE related application. The three-mode antenna system further includes an antenna auxiliary body 111 coupled to a WiFi IC 112 for a WiFi related application, wherein the antenna auxiliary body 111 is parasitically coupled to a side of the zigzag antenna 110 as shown in FIG. 11A. Another antenna auxiliary body 115 is coupled to a Bluetooth IC 116 for a related application, wherein the antenna auxiliary body 115 is parasitically coupled to a central of the zigzag antenna 110 as shown in FIG. 11A.

Figure 11B:
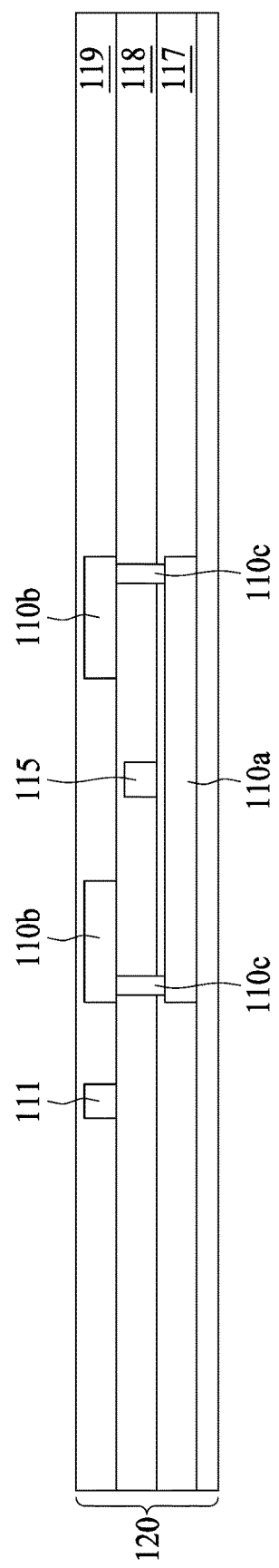
FIG. 11B is a cross-sectional view taken along the lines 11-11 of FIG. 11A.

FIG. 11B is a cross-sectional view taken along the lines 11-11 of FIG. 11A. Please note that for simplicity, FIG. 11B only illustrates an RDL 120 where the antenna bodies reside. As can be seen from FIG. 11B, the zigzag antenna 110 is comprised of conductive lines 110a and 110b formed in dielectric layers 117 and 119 of the RDL 120. The antenna auxiliary body 111 is formed in the dielectric layer 109 of the RDL 120. The antenna auxiliary body 115 is formed in the dielectric layer 108 of the RDL 120 so as to pass through the central of the zigzag antenna 110 and be surrounded by the conductive lines 110a and 110b. Vias 110c is formed in the dielectric layers 117 and 118 so as to interconnect the conductive lines 100a and 100b and thereby forming the zigzag antenna 110. The antenna main body 110 and auxiliary bodies 111 and 115 may be formed through a pattern and deposition operation in the RDL 120 as mentioned above. However, this is not a limitation of the present disclosure.

The disclosed multi-mode antenna possesses a compact and simple structure and can be realized in various applications with different frequencies. Compared with a system using individual antennas for different modes separately, the present disclosure has a reduced area, cost and interference between antennas. In addition, the multi-mode antenna with various embodiments illustrated is easy to be integrated in wafer level package process.

Some embodiments of the present disclosure provide a fan-out package structure, including an antenna main body; a redistribution layer (RDL); and an antenna auxiliary body in the RDL.

In some embodiments of the present disclosure, the antenna main body provides resonance at a first frequency.

In some embodiments of the present disclosure, the antenna auxiliary body provides resonance at a second frequency through parasitic coupling to the antenna main body.

In some embodiments of the present disclosure, the first frequency is higher than the second frequency.

In some embodiments of the present disclosure, the antenna main body locates in the RDL.

In some embodiments of the present disclosure, the antenna main body locates in a layer neighboring to the RDL, and gaps in the layer is filled by molding material.

In some embodiments of the present disclosure, the antenna main body is a spiral coil.

In some embodiments of the present disclosure, the antenna auxiliary body includes a conductive line parallel to a side of the antenna main body.

In some embodiments of the present disclosure, further includes a first die connected to the RDL so that the first die is connected to the antenna main body through the RDL.

In some embodiments of the present disclosure, the first die includes a function relates to a charging application.

In some embodiments of the present disclosure, further includes a second die connected to the RDL so that the second die is connected to the antenna auxiliary body through the RDL.

In some embodiments of the present disclosure, the second die includes a function relates to a wireless communication system.

Some embodiments of the present disclosure provide an antenna system, including: an antenna main body, arranged to provide a first resonance; and an antenna auxiliary body, arranged to provide a second resonance through parasitic coupling to the antenna main body; wherein a dimension of the antenna main body is greater than a dimension of the antenna auxiliary body.

In some embodiments of the present disclosure, the antenna main body is a spiral coil.

In some embodiments of the present disclosure, the antenna main body is a planar meandered inverted-F antenna (MIFA).

In some embodiments of the present disclosure, the antenna main body is a zigzag antenna.

In some embodiments of the present disclosure, the antenna auxiliary body is at least partially parallel to the antenna main body.

In some embodiments of the present disclosure, the antenna auxiliary body at least partially overlaps with the antenna main body.

Some embodiments of the present disclosure provide a semiconductor packaging method, including: providing a carrier; adhering an antenna main body on the carrier to provide a first resonance; disposing an antenna auxiliary body in a redistribution layer (RDL) over the carrier so as to provides a second resonance through parasitic coupling to the antenna main body; wherein the first resonance is different from the second resonance.

In some embodiments of the present disclosure, the method further includes: adhering a die on the carrier; and connecting the antenna main body with the die through the RDL.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A fan-out package structure, comprising:
a molding layer filled by a molding material, the molding layer having a top surface and a bottom surface opposite to the top surface of the molding layer;
an antenna main body in the molding layer, the antenna main body having a top surface and a bottom surface opposite to the top surface of the antenna main body, and the top surface of the antenna main body being coplanar with the top surface of the molding layer;
a redistribution layer (RDL) neighboring to the molding layer;
an antenna auxiliary body in the RDL;
a first die having a top surface and a bottom surface opposite to the top surface of the first die, wherein the first die is in the molding layer, and the bottom surface of the first die is level with the bottom surface of the antenna main body and the bottom surface of the molding layer.

2. The fan-out package structure of claim 1, wherein the antenna main body provides resonance at a first frequency.

3. The fan-out package structure of claim 2, wherein the antenna auxiliary body provides resonance at a second frequency through parasitic coupling to the antenna main body.

4. The fan-out package structure of claim 3, wherein the first frequency is higher than the second frequency.

5. The fan-out package structure of claim 1, wherein the antenna main body is a spiral coil.

6. The fan-out package structure of claim 1, wherein the antenna auxiliary body comprises a conductive line substantially parallel to a side of the antenna main body.

7. The fan-out package structure of claim 1, wherein the first die is connected to the RDL so that the first die is connected to the antenna main body through the RDL.

8. The fan-out package structure of claim 7, wherein the first die is arranged to detect a wireless charger positioned within a near-field region and transmit wireless power via near-field resonance.

9. The fan-out package structure of claim 1, further comprising a second die connected to the RDL so that the second die is connected to the antenna auxiliary body through the RDL.

10. The fan-out package structure of claim 9, wherein the second die includes a Bluetooth transceiver.

11. An antenna system, comprising:
a molding layer filled by a molding material, the molding layer having a top surface and a bottom surface opposite to the top surface of the molding layer;
an antenna main body in the molding layer, the antenna main body having a top surface and a bottom surface opposite to the top surface of the antenna main body, the antenna main body being arranged to provide a first resonance, and the top surface of the antenna main body being coplanar with the top surface of the molding layer;
an antenna auxiliary body in a layer neighboring to the molding layer, the antenna auxiliary body being arranged to provide a second resonance through parasitic coupling to the antenna main body; and
a die having a top surface and a bottom surface opposite to the top surface of the die, wherein the die is in the molding layer, and the bottom surface of the die is level with the bottom surface of the antenna main body and the bottom surface of the molding layer;
wherein a dimension of the antenna main body is greater than a dimension of the antenna auxiliary body.

12. The antenna system of claim 11, wherein the antenna main body is a spiral coil.

13. The antenna system of claim 11, wherein the antenna main body is a planar meandered inverted-F antenna (MIFA).

14. The antenna system of claim 11, wherein the antenna main body is a zigzag antenna.

15. The antenna system of claim 11, wherein the antenna auxiliary body is at least partially parallel to the antenna main body.

16. The antenna system of claim 11, wherein the antenna auxiliary body at least partially overlaps with the antenna main body.

17. A semiconductor packaging method, comprising:
providing a carrier;
adhering an antenna main body on the carrier to provide a first resonance, the antenna main body having a top surface and a bottom surface opposite to the top surface of the antenna main body;
adhering a die on the carrier, the die having a top surface and a bottom surface opposite to the top surface of the die;
dispensing a molding material on the carrier to encompass the antenna main body, wherein the bottom surface of the die is level with the bottom surface of the antenna main body and a bottom surface of the molding material;

performing a Chemical Mechanical Polish (CMP) operation to thin the molding material until the antenna main body is exposed;

disposing an antenna auxiliary body in a redistribution layer (RDL) over the molding material so as to provide a second resonance through parasitic coupling to the antenna main body;

wherein the first resonance is different from the second resonance.

18. The semiconductor packaging method of claim 17, further comprising:

connecting the antenna main body with the die through the RDL.

* * * * *